United States Patent
Karp et al.

[11] Patent Number: 5,249,578
[45] Date of Patent: Oct. 5, 1993

[54] ULTRASOUND IMAGING SYSTEM USING FINITE IMPULSE RESPONSE DIGITAL CLUTTER FILTER WITH FORWARD AND REVERSE COEFFICIENTS

[75] Inventors: Sydney M. Karp, Reading, Mass.; Raymond A. Beaudin, Windham, N.H.

[73] Assignee: Hewlett-Packard Company, Palo Alto, Calif.

[21] Appl. No.: 945,313

[22] Filed: Sep. 15, 1992

[51] Int. Cl.$^5$ ............................................. A61B 8/00
[52] U.S. Cl. ................................. 128/661.01; 73/626
[58] Field of Search ................. 128/660.01, 661.01, 128/660.06; 73/625, 626; 367/7, 11, 105

[56] References Cited

U.S. PATENT DOCUMENTS

| | | | |
|---|---|---|---|
| 5,113,706 | 5/1992 | Pittaro | 73/626 |
| 5,121,364 | 6/1992 | O'Donnell | 128/660.06 |
| 5,172,343 | 12/1992 | O'Donnell | 128/661.01 |
| 5,203,335 | 4/1993 | Noujaim et al. | 128/661.01 |

OTHER PUBLICATIONS

S. Thomas Alexander, Adaptive Signal Processing, Springer-Verlag, 1986, Chapter 3, pp. 34–45.
M. A. Brandestini et al, "Blood Flow Imaging Using A Discrete Time Frequency Meter", 1978 Ultrasonics Sym. Proc., pp. 348–352.
M. Brandestini, "Topoflow-A Digital Full Range Doppler Velocity Meter", IEEE Trans. Sonics & Ultra., vol. SU-25, No. 5, Sep. 1978, pp. 287–293.
M. K. Eyer et al., "Color Digital Echo Doppler Image Presentation", Ultrasound in Med. & Biol., vol. 7, pp. 21–31.

Primary Examiner—William E. Kamm
Assistant Examiner—George Manuel

[57] ABSTRACT

An asymmetric finite impulse response digital filter, typically used in an ultrasound imaging system, includes forward and reverse sections. In the forward section, a group of input data samples is multiplied by a set of filter coefficients in a forward order to provide first intermediate results. The first intermediate results are summed to provide a first output sample. In the reverse section, the group of input data samples is multiplied by the set of coefficients in a reverse order as compared with the forward section to provide second intermediate results. The second intermediate results are summed to provide a second output sample. The process is repeated to provide multiple first and second output samples. A signal estimation unit estimates a characteristic of the input data samples, such as the frequency of a Doppler ultrasound signal, based on the first and second output samples. The filter provides twice as many output samples as prior art filters for a given set of input data samples. The filter is preferably used as a clutter filter to remove low frequency clutter from a Doppler ultrasound signal.

10 Claims, 6 Drawing Sheets

ULTRASOUND IMAGING SYSTEM USING FINITE IMPULSE RESPONSE DIGITAL CLUTTER FILTER WITH FORWARD AND REVERSE COEFFICIENTS

FIELD OF THE INVENTION

This invention relates to finite impulse response filters used in digital signal processing and, more particularly, to finite impulse response filters having forward and reverse sets of coefficients to provide an increased number of output samples for a given set of input data. The finite impulse response digital filters of the present invention are particularly useful in ultrasound imaging systems, but are not limited to such use.

BACKGROUND OF THE INVENTION

Digital filters are frequently used for signal processing in systems, such as ultrasound imaging systems, where the set of input data to be processed is limited. In color Doppler imaging, stationary and slowly moving targets produce large, low frequency signals. These unwanted signals need to be removed by a clutter filter in order to detect higher frequency Doppler blood echoes. When a finite impulse response (FIR) digital filter is used, the number of valid output samples is further limited as described below. The limited number of output samples may result in erroneous estimates of signal characteristics. For example, an FIR filter may be used to remove clutter from a Doppler ultrasound signal. The signal characteristic to be estimated is the mean frequency of the Doppler ultrasound signal in the presence of noise. A limited number of output samples can yield a poor estimate of frequency. In an ultrasound imaging system, Doppler measurements are taken at multiple points to produce an ultrasound image. An increase in the number of samples at each point would unacceptably reduce the ultrasound scan rate.

A conventional finite impulse response digital filter receives digital samples of an input signal. The filter includes multiple delay stages. The output of each delay stage is multiplied by a filter coefficient, and the outputs of the multipliers are summed to provide an output sample. When the set of input samples is limited, the number of output samples from the FIR filter depends on both the number of input samples and the number of stages in the filter. For example, when the input data contains sixteen samples and the filter has five stages, or coefficients, the filter provides twelve output samples. An output sample is provided for input samples 1-5, 2-6, . . . 12-16. The number of output samples can be increased by reducing the number of stages, or coefficients, in the FIR filter. However, this "shorter" FIR filter provides less flexibility as to shaping its characteristics and may not remove undesirable components of the input signal.

SUMMARY OF THE INVENTION

The present invention provides methods and apparatus for estimating a characteristic of a signal. For example, the methods and apparatus of the invention can be used in an ultrasound imaging system to estimate the frequency of a Doppler ultrasound signal, which is representative of velocity. The apparatus utilizes an asymmetric finite impulse response (FIR) digital filter having forward and reverse sections. The apparatus comprises a multiplier means for multiplying a group of input data samples representing the signal by a set of coefficients in a first order to provide first intermediate results and for multiplying the group of input data samples by the set of coefficients in a second order that is the reverse of the first order to provide second intermediate results, and summing means for summing the first intermediate results to provide a first output sample and for summing the second intermediate results to provide a second output sample. The multiplier means and the summing means process multiple groups of input samples to provide multiple first and second output samples. The apparatus further comprises means responsive to the first and second output samples for estimating the desired characteristic of the signal.

The multiplier means and the summing means constitute a finite impulse response digital filter having a forward section and a reverse section. In the forward section, the input samples are multiplied by the coefficients in a forward (first) order to produce the first output samples. In the reverse section, the input samples are multiplied by the same coefficients in a reverse (second) order to provide the second output samples. The process is repeated for multiple groups of input samples to provide multiple output samples. The FIR filter of the invention produces twice as many output samples as prior art FIR filters for a given set of input samples, thereby increasing accuracy.

In a first embodiment, the finite impulse response digital filter includes delay means for delaying the group of input samples by successive discrete time increments to provide delayed input samples to the multiplier means substantially simultaneously. All the intermediate results required for calculating an output sample are available at the same time. The multiplier means includes a plurality of first multipliers for multiplying the delayed input samples by the set of coefficients in forward order to provide the first intermediate results and a plurality of second multipliers for multiplying the delayed input samples by the set of coefficients in reverse order to provide the second intermediate results. Pairs of output samples are available sequentially as the input data samples are received by the filter.

In a second embodiment of the invention, the multiplier means comprises a plurality of first multipliers for multiplying the input data samples by the set of coefficients in forward order to provide first intermediate results and a plurality of second multipliers for multiplying the input data samples by the set of coefficients in reverse order to provide second intermediate results. The summing means comprises a plurality of first accumulators respectively coupled to the first multipliers for sequentially accumulating first intermediate results generated by the first multipliers and a plurality of second accumulators respectively coupled to the outputs of the second multipliers for sequentially accumulating the second intermediate results generated by the second multipliers. Each first accumulator provides one of the first output samples after accumulation of the first intermediate results, and each second accumulator provides one of the second output samples after accumulation of the second intermediate results. The output samples can be transferred from the accumulators into output buffer registers and transferred serially from the output buffer registers. Multiplexers provide selected coefficients to the first multipliers and to the second multipliers.

According to a further aspect of the invention, there is provided a medical ultrasound imaging system comprising means for transmitting ultrasound energy into a target region of a patient, means for receiving ultrasound energy that was transmitted into the target region of the patient and providing a received signal, means for converting the received signal to a group of input data samples, a finite impulse response digital filter having forward and reverse sections as described above for providing multiple first and second output samples in response to multiple groups of input samples, means responsive to the multiple first and second output samples for estimating velocities in the target region, and means for displaying the velocities in the target region. The finite impulse response digital filter is preferably used as a clutter filter to remove low frequency clutter from a Doppler ultrasound signal.

According to another aspect of the invention, there is provided a method for estimating a characteristic of a signal, comprising the steps of electronically multiplying a group of input data samples representing the signal by a set of coefficients in a forward order to provide first intermediate results, electronically multiplying the group of input data samples by the set of coefficients in a reverse order to provide second intermediate results, electronically summing the first intermediate results to provide a first output sample, electronically summing the second intermediate results to provide a second output sample, repeating the multiplying and summing steps for multiple groups of input samples to provide multiple first and second output samples, and electronically estimating the desired characteristic of the signal in response to the first and second output samples.

BRIEF DESCRIPTION OF THE DRAWINGS

For a better understanding of the present invention, reference is made to the accompanying drawings which are incorporated herein by reference and in which.

DETAILED DESCRIPTION OF THE INVENTION

Figure 1:
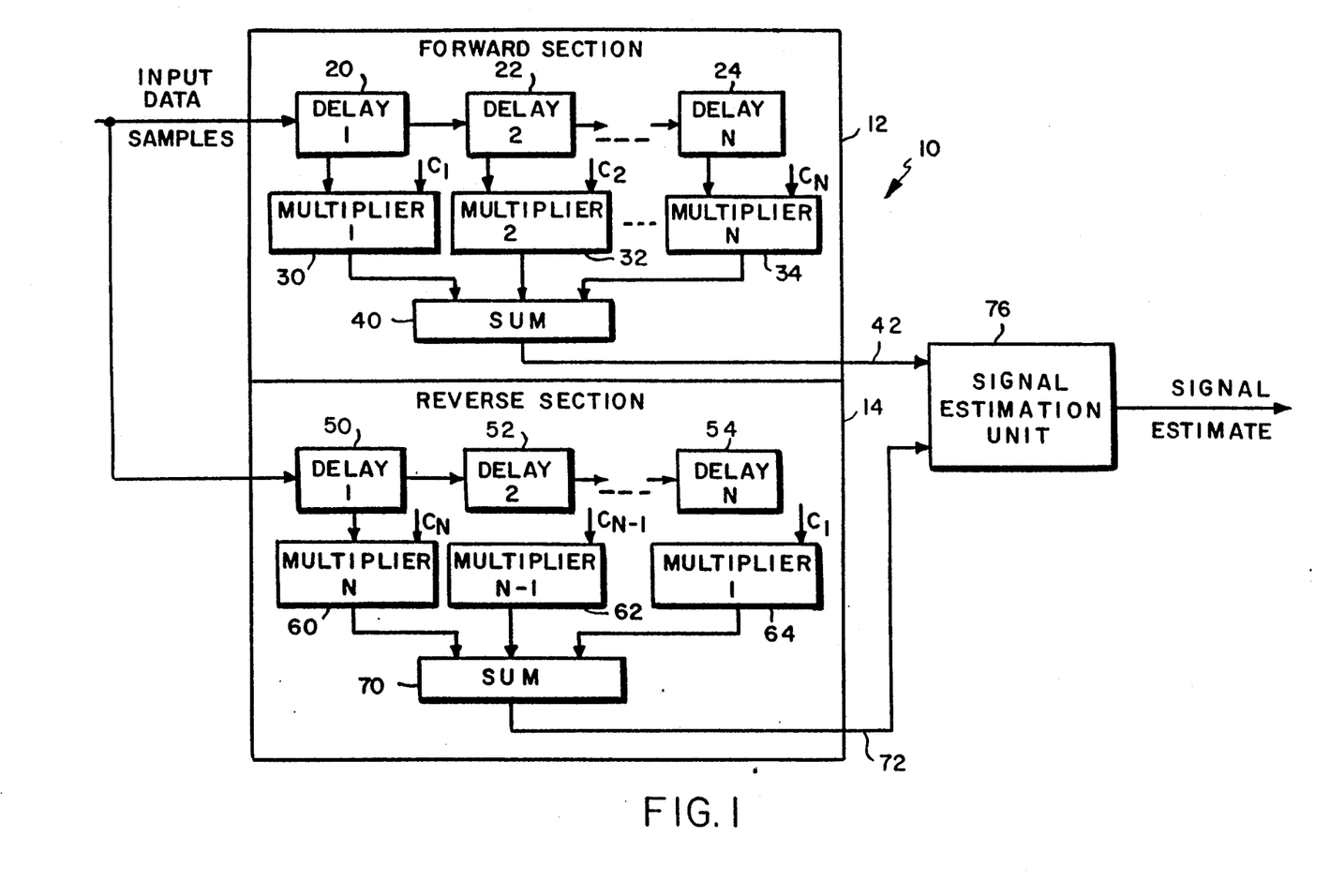
FIG. 1 is a block diagram of a first embodiment of a finite impulse response digital filter in accordance with the present invention.

A block diagram of a first embodiment of apparatus including a finite impulse response (FIR) digital filter in accordance with the present invention is shown in FIG. 1. As described below, the apparatus is preferably incorporated into an ultrasound imaging system, but is not limited to this use. An FIR filter 10 includes a forward section 12 and a reverse section 14. The forward section 12 includes N serially connected delay stages 20, 22, . . . 24. The output of each delay stage is connected to the input of the following delay stage and to one input of a multiplier. Thus, delay stage 20 is connected to a first input of a multiplier 30, delay stage 22 is connected to a first input of a multiplier 32 and delay stage 24 is connected to a first input of a multiplier 34. Filter coefficients $C_1, C_2, \ldots C_n$ are connected to the second inputs of multipliers 30, 32, . . . 34, respectively. The outputs of multipliers 30, 32, . . . 34, are connected to the inputs of a summing unit 40.

The reverse section 14 of FIR filter 10 includes N serially connected delay stages 50, 52, . . . 54. The output of each of the delay stages is connected to the input of the following delay stage and to one input of a multiplier. The output of delay stage 50 is connected to a first input of a multiplier 60, the output of delay stage 52 is connected to a first input of a multiplier 62 and the output of delay stage 54 is connected to a first input of a multiplier 64. Filter coefficients $C_N, C_{N-1} \ldots, C_1$ are connected to second inputs of multipliers 60, 62, . . . 64. The outputs of multipliers 60, 62, . . . 64 are applied to the inputs of a summing unit 70.

The same filter coefficients $C_1, C_2, \ldots C_N$ are used in the forward section 12 and the reverse section 14 of the FIR filter 10. However, the order of the coefficients in reverse section 14 is reversed with respect to the order of the coefficients in forward section 12. Thus, coefficient $C_1$ is applied to the first stage multiplier 30 in forward section 12, whereas coefficient $C_N$ is applied to the first stage multiplier 60 in reverse section 14. Similarly, coefficient $C_N$ is applied to last stage multiplier 34 in forward section 12, and coefficient $C_1$ is applied to last stage multiplier 64 in reverse section 14. The order of the coefficients in the remaining stages is similarly reversed.

The input data samples are typically samples of an input analog signal. Each input data sample is typically 8 to 12 bits. However, the present invention is not limited to any number of bits in the input data samples. The input data samples are provided to the input of delay stage 20 in forward section 12 and to the input of delay stage 50 in reverse section 14. Each delay stage typically comprises a shift register having one bit for each bit of the input data sample. The delay stages in forward section 12 and reverse section 14 are clocked at a rate determined by the input data rate so that the data samples propagate through the delay stages in successive discrete time increments.

When input data samples have been loaded into the delay stages 20, 22, . . . 24 and delay stages 50, 52, . . . 54, the respective multipliers are enabled. The input samples stored in each of the delay stages are multiplied by the respective filter coefficients. Thus, delayed input samples are applied by delay stages 20, 22, . . . 24 to multipliers 30, 32, . . . 34, respectively. The delayed input samples are multiplied by coefficients $C_1, C_2, \ldots C_N$, respectively, to provide first scaled samples, and the first scaled samples are input by multipliers 30, 32, . . . 34 to summing unit 40. The summing unit 40 provides a first output sample on an output line 42.

Similarly, delayed input samples are applied by delay stages 50, 52, . . . 54 to multipliers 60, 62, . . . 64, respectively. The delayed input samples are multiplied by coefficients $C_N, C_{N-1}, \ldots C_1$, respectively, to provide second scaled samples, multipliers 60, 62, . . . 64 input second scaled samples to summing unit 70. The summing unit 70 provides a second output sample on an output line 72.

No output samples are provided until input data samples are present in all of the delay stages 20, 22, . . . 24. At this time, two output samples are provided substantially simultaneously from the forward and reverse sections. Then, two output samples are provided for each successive input data sample until completion of the input data set.

In the example of FIG. 1, the output samples from the FIR filter 10 are provided to a signal estimation unit 76 which is described below. It will be understood that the present invention is not limited as to the type of input signal or the characteristic of the input signal that is being determined. However, the FIR filter of the present invention is preferably used to estimate the frequency of a Doppler ultrasound signal in an ultrasound imaging system. In the FIR filter 10 shown in FIG. 1, the delay stages can be implemented as shift registers, and the multipliers and the summing units can be conventional digital elements having a suitable operating speed.

In the FIR filter 10 shown in FIG. 1, the output samples on lines 42 and 72 occur substantially simultaneously. As described below, the present invention can be utilized to provide serial output samples. However, in either case, the FIR filter of the present invention provides two output samples for every one output sample provided by prior art FIR filters. As a result, the accuracy of the signal characteristic being estimated is increased, since more information is available for making the estimate. The present invention can also be considered as increasing the sensitivity of the system.

Figure 2:
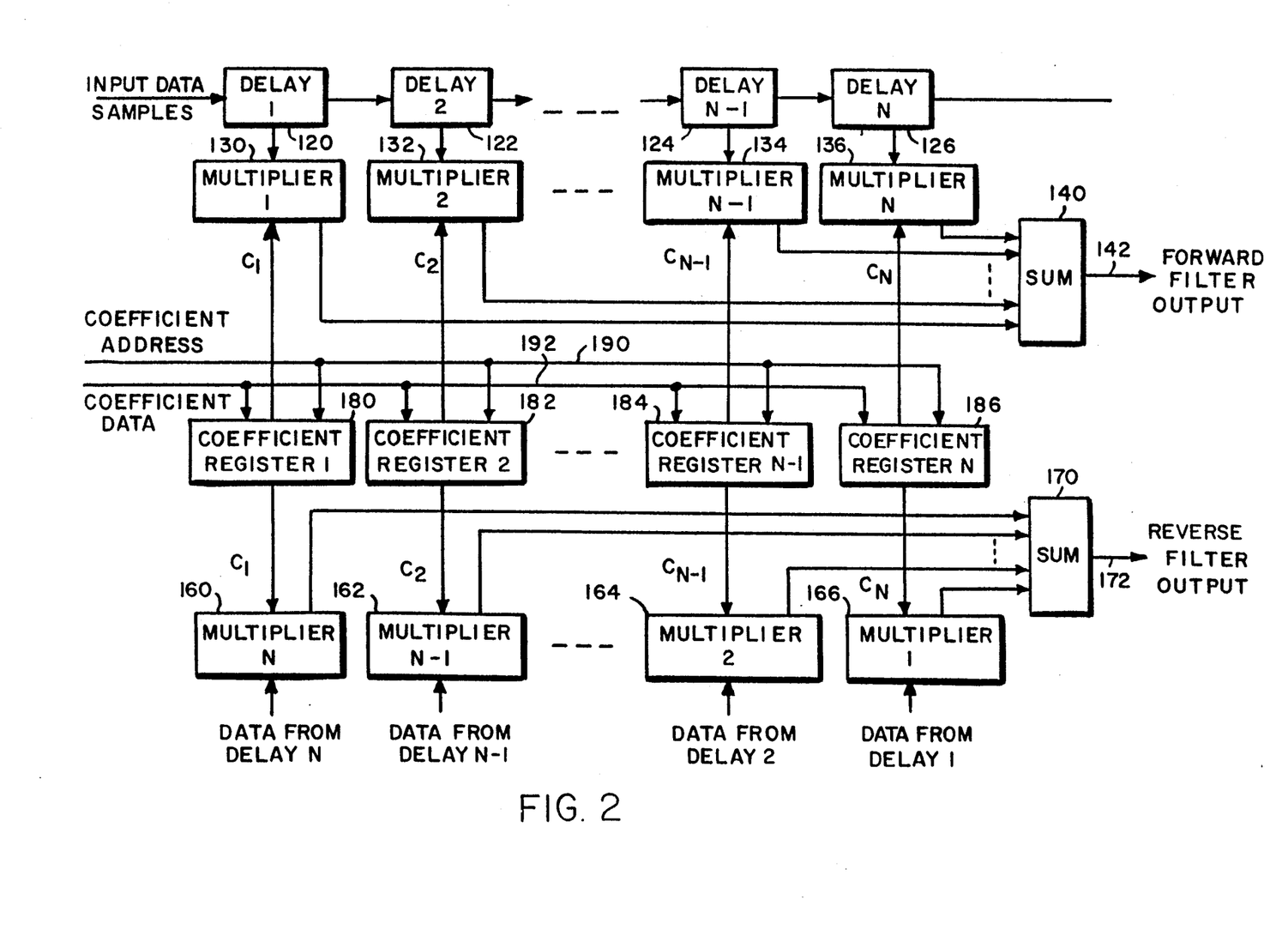
FIG. 2 is a block diagram of an implementation of the finite impulse response digital filter shown in FIG. 1.

An example of an implementation of the finite impulse response digital filter of FIG. 1 is shown in FIG. 2. In the diagram, data lines represent multiple parallel bits. The FIR filter shown in FIG. 2 provides parallel operation. Thus, output samples from the forward section and the reverse section of the filter are provided substantially simultaneously.

Data samples are input to a first delay stage 120. Delay stages 120, 122, . . . 124 and 126 are connected serially. Delay stages 120 and 122 are the first two stages of the filter, and delay stages 124 and 126 are the last two delay stages of the filter. The output of each delay stage is connected to the input of the next delay stage so that the input data samples propagate through the delay stages and are successively delayed. As indicated above in connection with FIG. 1, the delay stages can comprise shift registers or latches with one bit for each bit of the input data sample. The number N of delay stages corresponds to the number of stages in the FIR filter.

The output of delay stage 120 is connected to a first input of a multiplier 130, and the output of delay stage 122 is connected to a first input of a multiplier 122. Similarly, the output of delay stage 124 is connected to a first input of multiplier 124, and the output of delay stage 126 is connected to a first input of a multiplier 136. A filter coefficient $C_1$ is connected from a coefficient register 180 to a second input of multiplier 130, and a filter coefficient $C_2$ is connected from a coefficient register 182 to a second input of multiplier 132. Similarly, a filter coefficient $C_{N-1}$ is connected from a coefficient register 184 to a second input of multiplier 134, and a coefficient $C_N$ is connected from a coefficient register 186 to a second input of multiplier 136. The outputs of multipliers 130, 132, . . . 134 and 136 are connected to the inputs of a summing unit 140.

The output of last delay stage 126 is connected to a first input of a multiplier 160, and the output of delay stage 124 is connected to a first input of a multiplier 162. Similarly, the output of delay stage 122 is connected to a first input of a multiplier 164, and the output of first delay stage 120 is connected to a first input of a multiplier 166. The filter coefficient $C_1$ is connected from coefficient register 180 to a second input of multiplier 160, and filter coefficient $C_2$ is connected from coefficient register 182 to a second input of multiplier 162. Similarly, the filter coefficient $C_{N-1}$ is connected from coefficient register 184 to a second input of multiplier 164, and filter coefficient $C_N$ is connected from coefficient register 186 to a second input of multiplier 166. The outputs of multipliers 160, 162, . . . 164 and 166 are connected to the inputs of a summing unit 170.

The multipliers 130, 132, . . . 134 and 136 and the summing unit 140 are parts of a forward section of the FIR filter. The multipliers 160, 162, . . . 164 and 166 and summing unit 170 are parts of a reverse section of the FIR filter. The delay stages 120, 122, . . . 124 and 126 and the coefficient registers 180, 182, . . . 184 and 186 are common to the forward and reverse sections of the FIR filter. It can be seen that the order of the filter coefficient with respect to the input data samples in the delay stages is effectively reversed between the forward section and the reverse section of the FIR filter shown in FIG. 2. That is, in the forward section, the data sample from first delay stage 120 is multiplied by first filter coefficient $C_1$, whereas in the reverse section, the data sample from first delay stage 120 is multiplied by last filter coefficient $C_N$.

The operation of the FIR filter shown in FIG. 2 is essentially the same as the operation of the FIR filter shown in FIG. 1 and described above. The input data samples are successively delayed by delay stages 120, 122, . . . 124 and 126. The delayed input samples are multiplied by the respective coefficients $C_1, C_2, \ldots C_N$ in multipliers 130, 132, . . . 134 and 136 to provide first scaled data samples which are summed by summing unit 140. The output of summing unit 140 on line 142 is a first output sample from the forward section of the filter. Similarly, the delayed data samples are multiplied by the respective coefficients $C_N, C_{N-1}, \ldots C_1$ in reverse order by multipliers 160, 162, . . . 164 and 166 to provide second scaled samples to summing unit 170. The output of summing unit 170 on line 172 is a second output sample. As described above, the number of output samples on each of the lines 142 and 172 depends on the number of input data samples and the number of stages in the FIR filter. However, the filter shown in FIG. 2 provides twice as many output samples as compared with prior art FIR filters which include only a forward section.

Coefficient registers 180, 182, . . . 184 and 186 receive coefficient information from a controller or computer (not shown) on a coefficient address bus 190 and a coefficient data bus 192. This configuration permits the filter coefficients $C_1, C_2, \ldots C_{N-1}$ and $C_N$ to be programmable so that the characteristics of the FIR digital filter can be changed. Also, less than the full number N of stages in the FIR filter can be utilized by disabling undesired stages.

Figure 3:
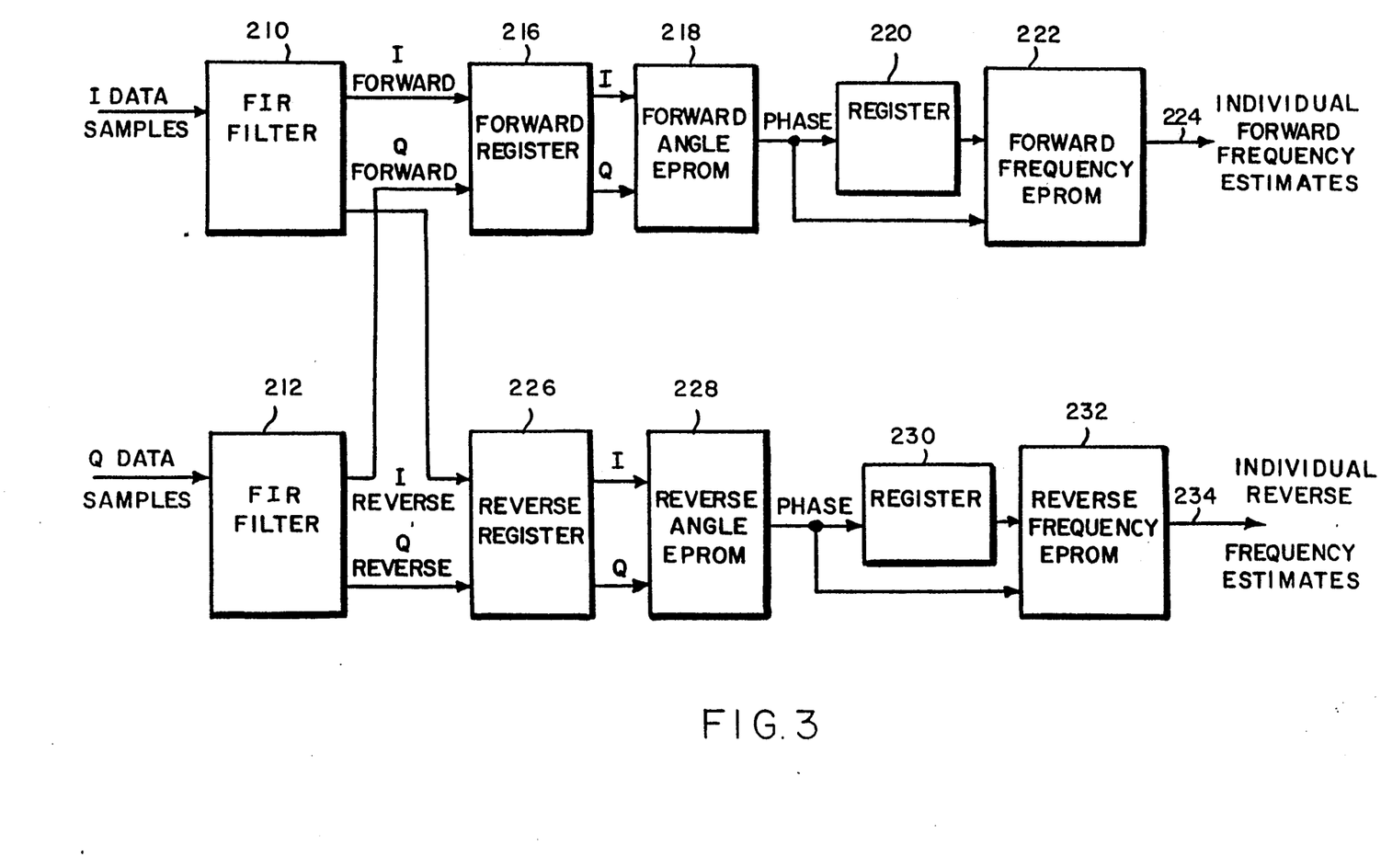
FIG. 3 is a block diagram that illustrates use of the finite impulse response digital filter of FIG. 2 to estimate the frequency of a Doppler ultrasound signal.

An example of an application of the FIR digital filter in accordance with the present invention is shown in FIG. 3. Two FIR filters are used in a Doppler ultrasound system for estimating Doppler frequency. In phase, I, data samples are applied to a first FIR filter 210, and quadrature, Q, data samples are applied to a second FIR filter 212. The I and Q data samples represent the in phase and quadrature components of the Doppler frequency, respectively, and are extracted from the received ultrasound signal in accordance with known techniques. Typically, the received signal is mixed with local oscillator signals that are 90° out of phase, and the I and Q analog signals are digitized to provide the I and Q data samples. Each of the FIR filters 210 and 212 includes a forward section and a reverse section and can be constructed as illustrated in FIG. 2 and discussed above. An I forward output of filter 210 and a Q forward output of filter 212 are input to a register 216. I and Q outputs of register 216 address an angle PROM 218. The output of PROM 218 is the phase angle between the I and Q components. The phase angle output of PROM 218 is input to a register 220 and to a frequency PROM 222. The output of register 220 is input to frequency PROM 222. The register 220 provides a delay such that the input to frequency PROM 222 represents two successive phase measurements. The frequency PROM 222 outputs a frequency estimate on a line 224 by determining the difference between the two successive phase measurements at its input.

In a similar manner, an I reverse output of filter 210 and a Q reverse output of filter 212 are input to a register 226. A second frequency estimation channel includes register 226, an angle PROM 228, a register 230 and a frequency PROM 232 which are connected and function in the same manner as the register 216, angle PROM 218, register 220 and frequency PROM 222 described above. The second channel provides a second set of frequency estimates on a line 234. The individual frequency estimates on output lines 224 and 234 are combined into a single frequency estimate representing the entire input data set. The input data required to form a single frequency estimate (a combination of individual frequency estimates) is known as a packet, and the length of this input data is the packet length. The combining of estimates can be performed in a number of ways. For example, a simple arithmetic mean can be calculated. More involved techniques are known to those skilled in the art. Such techniques are outside the scope of the present invention. Since twice as many individual frequency estimates are produced for a given number of input data samples, a more accurate estimation of frequency is made. It will be understood that the FIR digital filter of the present invention is not limited to estimation of frequency as shown in FIG. 3 and described above.

The FIR digital filters shown in FIGS. 1-3 and described above utilize an FIR filter structure wherein input data samples are stored in a delay line. All input data samples needed to compute a single filter output sample are available at the same time. The filter completely computes an output data sample and then shifts the input data down the delay line. It then proceeds to calculate the next output data sample until all output samples have been determined. The output samples from the forward and reverse sections of the FIR filter are output in parallel.

An architecture called an accumulating FIR filter for implementation of the present invention will now be described. In this architecture, an accumulator is dedicated to each output sample. As each input data sample is supplied to the filter, its N contributions to N output samples are calculated, and each contribution is stored in an appropriate accumulator. As each new input data sample is applied to the filter, the accumulators gradually build up the N output samples. When the last input data sample has been processed, all N output samples become available.

Figure 4:
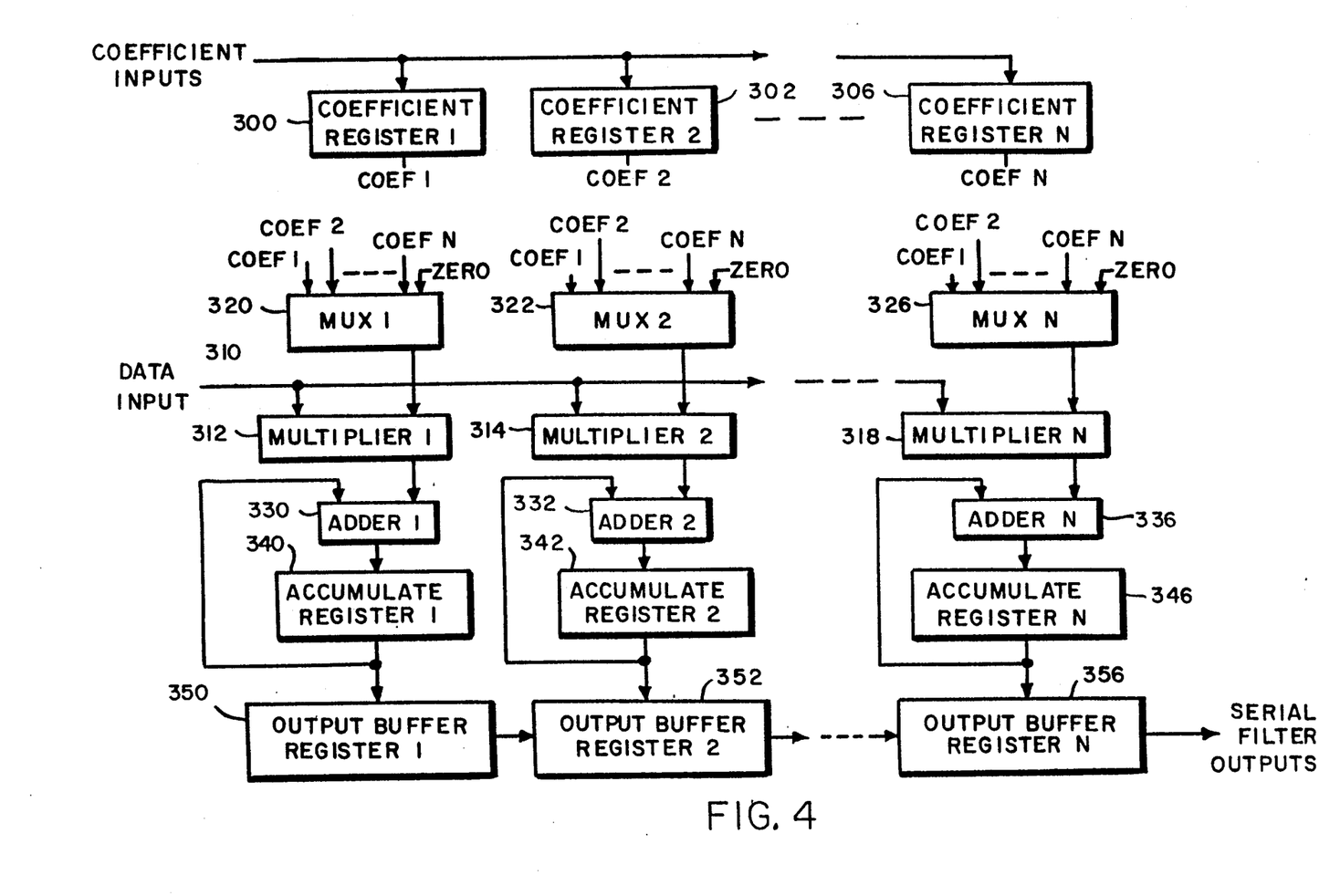
FIG. 4 is a block diagram of a second embodiment of the finite impulse response digital filter of the invention which utilizes an accumulating FIR filter.

An accumulating FIR filter in accordance with the invention is shown in FIG. 4. Coefficients $C_1$, $C_2$, ... $C_N$ are loaded into coefficient registers 300, 302, ... 306, respectively. Input data samples on an input line 310 are applied to a first input of each of multipliers 312, 314, ... 318. Multiplexers 320, 322, ... 326 have outputs connected to a second input of each of multipliers 312, 314, ... 318, respectively. Each of the multiplexers 320, 322, ... 326 receives coefficients $C_1$, $C_2$, ... $C_N$ from coefficient registers 300, 302 ... 306, and a zero input. Thus, each of the multiplexers 320, 322, ... 326 can apply a selected coefficient or zero to the input of the multiplier to which it is connected.

When a first input data sample is applied on line 310, the coefficient multiplexers 320, 322, ... 326 select the appropriate coefficients. The following discussion applies to the forward section of the FIR filter. For the first input data sample, multiplexer 320 selects coefficient $C_1$, and multiplexers 322 ... 326 select zero. When the second input data sample is applied, multiplexer 320 advances to coefficient $C_2$, and multiplexer 322 advances to coefficient $C_1$. The coefficients of the remaining multiplexers remain at zero. For the forward section of the FIR filter, when M is the packet length and N is the filter length:

$$O_1 = C_1^* I_1 + C_2^* I_2 + \ldots + C_N^* I_N$$
$$O_2 = C_1^* I_2 + C_2^* I_3 + \ldots + C_N^* I_{N+1}$$
$$\vdots$$
$$O_{M-N+1} = C_1^* I_{M-N+1} + C_2^* I_{M-N+2} + \ldots + C_N^* I_M$$

where I represents the input samples of the packet and O represents the output samples.

Each time an input data sample is applied and coefficients are selected, a set of multiplications is performed by multipliers 312, 314, ... 318. The outputs of multipliers 312, 314, ... 318 are applied to first inputs of adders 330, 332, ... 336, respectively. The outputs of adders 330, 332, ... 336 are input to accumulate registers 340, 342, ... 346, respectively. The outputs of accumulate registers 340, 342, ... 346 are applied to output buffer registers 350, 352, ... 356, respectively, and to second inputs of adders 330, 332, ... 336, respectively. The results of the multiplications for each input data sample are accumulated by each adder and accumulate register. When all the input data samples have been processed, the output samples are contained in the accumulate registers 340, 342, ... 346. The output samples are transferred to the output buffer registers 350, 352, ... 356, and the accumulate registers 340, 342, ... 346 are cleared, thereby allowing a new packet of input data samples to be processed. The filter output samples are then shifted out serially from registers 350, 352, ... 356.

In the reverse section (not shown) of the accumulating FIR filter, the circuitry, including multiplexers 320, 322, ... 326, multipliers 312, 314, ... 318, adders 330, 332, ... 336, accumulate registers 340, 342, ... 346 and output buffer registers 350, 352, ... 356, is duplicated. In the reverse section of the filter, the order of the coefficients is reversed. Thus, for the first input data sample, multiplexer 320 selects coefficient $C_N$ and the remaining multiplexers select zero. When the second input data sample is applied, multiplexer 320 selects coefficient $C_{N-1}$ and multiplexer 322 selects coefficient $C_N$. The output data samples are determined in accordance with:

$$O_1 = C_1^* I_1 + C_2^* I_2 + \ldots + C_N^* I_N$$
$$O_2 = C_1^* I_2 + C_2^* I_3 + \ldots + C_N^* I_{N+1}$$
$$\vdots$$
$$O_{M-N+1} = C_N^* I_{M-N+1} + C_{N-1}^* I_{M-N+2} + \ldots + C_1^* I_M$$

In the reverse section of the filter, the selection control line to the multiplexers are sequenced in reverse order as compared with the forward section to perform reverse filtering.

Figure 5:
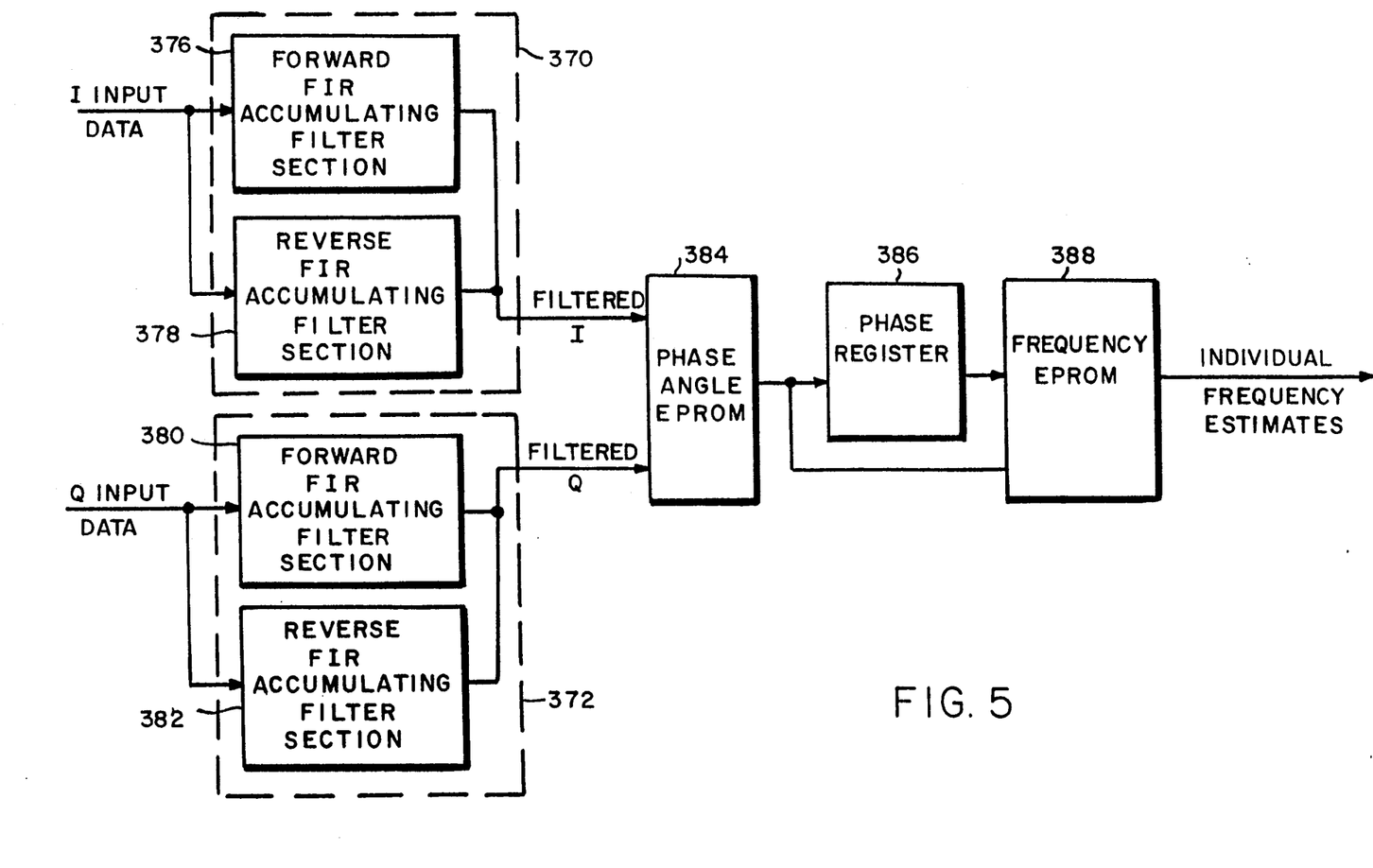
FIG. 5 is a block diagram that illustrates use of the accumulating finite impulse response digital filter of FIG. 4 to estimate the frequency of a Doppler ultrasound signal.

An application of the accumulating FIR digital filter in accordance with the present invention is shown in FIG. 5. Two accumulating FIR filters are used in a Doppler ultrasound system for estimating Doppler frequency. In phase, I, data samples are applied to a first accumulating FIR filter 370, and quadrature, Q, data samples are applied to a second accumulating FIR filter 372. The I and Q data samples represent the in phase and quadrature components of the Doppler frequency, respectively, as discussed above in connection with FIG. 3.

Accumulating FIR filter 370 includes a forward section 376 and a reverse section 378. Accumulating FIR filter 372 includes a forward section 380 and a reverse section 382. The filter sections 376, 378, 380 and 382 can be constructed as shown in FIG. 4 and discussed above.

The I output samples of filter 370 and the Q output samples of filter 372 are input to an angle PROM 384. When both the forward and reverse sections of each filter have calculated a set of output samples, they take turns outputting samples to the angle PROM 384. First, the forward filter sections 376 and 380 output all their stored output samples, followed by the reverse filter sections 378 and 382. The output of angle PROM 384 represents the phase angle between the I and Q components and is input to a phase register 386 and a frequency PROM 388. The output of phase register 386 is input to the frequency PROM 388. The frequency prom 388 outputs a frequency estimate by determining the difference between the two successive phase angle measurements at its inputs. One of the frequency estimates generated will be the difference between the last forward phase angle and the first reverse phase angle. This estimate is invalid and must be discarded.

Figure 6:
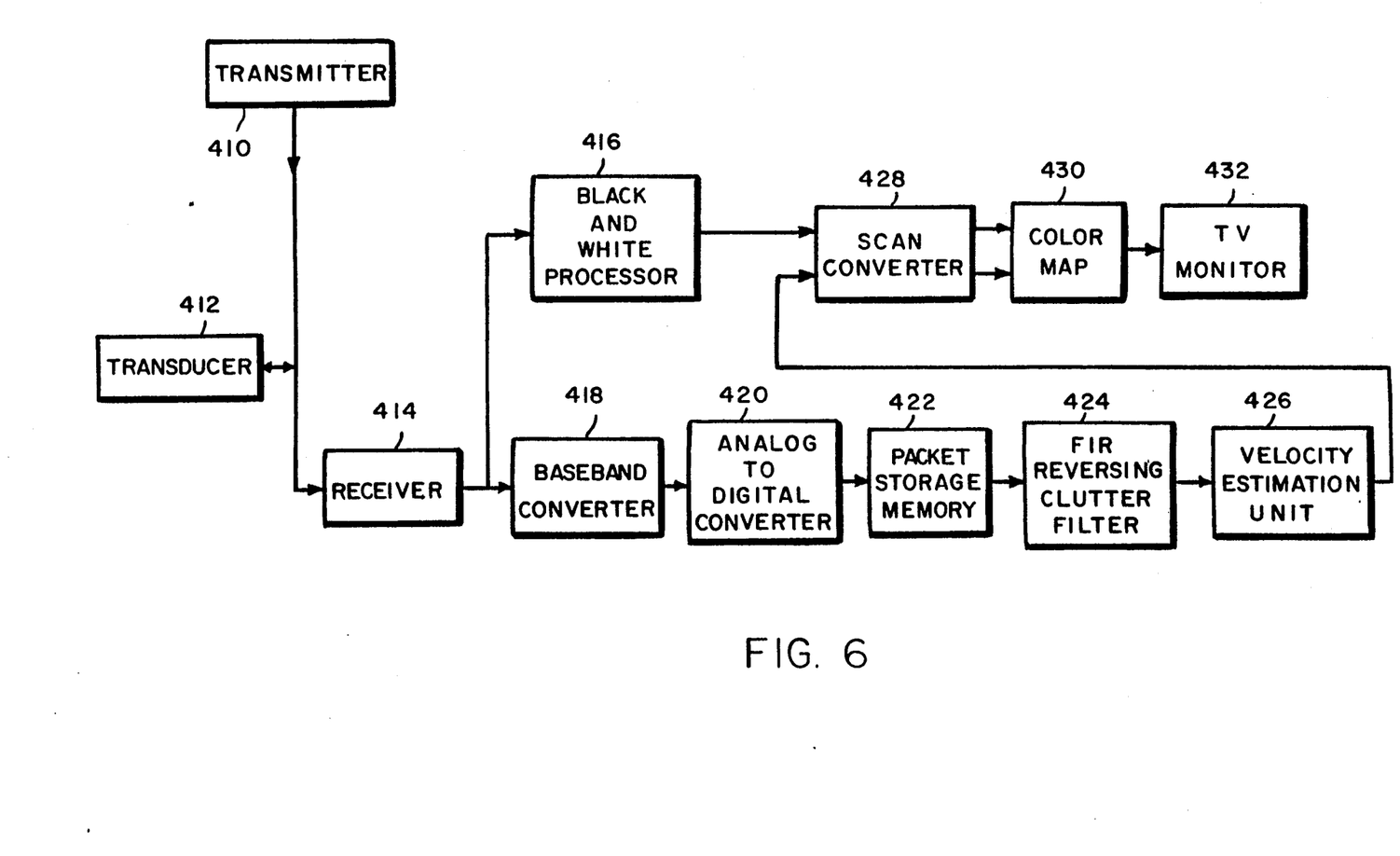
FIG. 6 is a block diagram of an ultrasound imaging system incorporating a finite impulse response digital filter in accordance with the present invention.

A block diagram of a medical ultrasound imaging system incorporating an FIR digital filter in accordance with the present invention is shown in FIG. 6. An ultrasound transmitter 410 transmits ultrasound energy through an ultrasound transducer 412, which typically includes an array of ultrasound transducer elements. The ultrasound energy is transmitted into a target region of a patient. A portion of the transmitted ultrasound energy is reflected by various components of the target region. Reflected ultrasound energy is received by the transducer 412 and is input to a receiver 414 which focuses the signals from the multiple transducer elements and converts RF to IF frequencies. The signals from receiver 414 are input to a black and white processor 416 and to a baseband converter 418. The baseband converter 418 converts IF frequencies to baseband and inputs the baseband signals to an analog-to-digital converter 420. Input data samples from A/D converter 420 are stored in a packet storage memory 422. The data samples are input to an FIR reversing clutter filter 424 which corresponds to the FIR digital filters shown and described hereinabove. As noted previously, in color Doppler imaging systems, stationary and slowly moving targets produce large, low frequency signals. These unwanted signals are removed by the clutter filter 424 in order to detect higher frequency Doppler blood echoes. Outputs of clutter filter 424 are input to a velocity estimation unit 426 which makes an estimate of the velocity of blood in the target region.

The velocity estimate and the output of black and white processor 416 are input to a scan converter 428 which converts the color and black and white data from polar coordinates to rectangular coordinates. A color map unit 430 maps black and white data and velocities output by scan converter 428 to color and brightness, which are displayed on a TV monitor 432.

In the block diagram of FIG. 6, the FIR clutter filter 424 corresponds to the filter 10 shown in FIGS. 1 and 2 or to the filter shown in FIGS. 4 and 5 and described above. The velocity estimation unit 426 corresponds to the signal estimation unit 76 shown in FIG. 1, the frequency estimation unit shown in FIG. 3, or the frequency estimation unit shown in FIG. 5.

The reversing FIR digital filter of the present invention produces twice as many output samples as prior art FIR filters. Parallel and serial architectures as described above are two different techniques for handling the larger number of output samples. In the parallel architecture, two output data streams are created: one data stream from the forward section of the FIR filter and one data stream from the reverse section. An advantage of this approach is that extra processing time is not required if the output data rates are as fast as the input data rates. However, extra hardware is required to calculate the forward and reverse filter outputs and to calculate forward and reverse frequency estimates.

The serial architecture maintains one data output stream by first outputting the forward filter section outputs into a single data channel followed by the reverse filter section outputs. When the output data rate is the same as the input data rate, extra processing time is required. For many FIR filters, this means that the input data rate must be interrupted at regular intervals, and throughput will be degraded. By increasing the output data rate, this disadvantage can be avoided. Higher output data rates require faster circuitry, which can be more expensive.

The FIR filter of the present invention using delay stages shown in FIGS. 1-3 has been described with parallel outputs. The accumulating FIR filter shown in FIGS. 4 and 5 has been described with serial outputs. It will be understood that either FIR filter architecture can be configured with parallel outputs or serial outputs within the scope of the present invention.

The filter architectures shown and described above have subtle advantages and disadvantages depending on the technology used to implement them. For example, the architecture shown in FIGS. 1-4 has an advantage in a technology where the large sum network is inexpensive to build. Likewise, the accumulating architecture of FIGS. 4 and 5 has an advantage in a technology where individual accumulators are easy to replicate.

The following describes how the FIR filter of the present invention overcomes the disadvantages of input sample weighting in FIR filters and explains why the present invention cannot be used with symmetric filters.

In FIR filters, each input data sample is effectively weighted when it is multiplied by a coefficient. In the case of a very small coefficient, the associated input data sample will have little contribution to the output sample. Information is essentially lost. When a coefficient is very large and coincides with an input data sample that is badly perturbed by noise, the resulting output sample may be severely corrupted. Information is again lost. The FIR filter of the present invention allows some of the information lost due to input sample weighting to be retrieved. It does so by generating a second set of output samples which is partially uncorrelated with the first set. The existence of an additional set of partially uncorrelated output samples permits superior signal estimation of the filter output signal. The second set of output samples is generated by using the same coefficients arranged in reverse order. The second set of output samples is partially uncorrelated with the first set since it contains information that the first set did not contain. This is because some input data samples are weighted more strongly in the second set than in the first.

Reversing the coefficients of a symmetric filter yields the same set of coefficients and an identical set of output samples. Thus, only asymmetric coefficient sets can be used in the FIR filter of the present invention. In addition, the more the reverse filter section differs from the forward filter section, the more effective it will be. Since negating all the coefficients of a filter does not produce a truly unique new set of output samples, the reverse filter section must also be substantially different from the negation of the forward filter section.

A variation of the FIR filter of the invention is to replace the reverse coefficients with a totally new filter. In this case, the input data is processed with two different filters, and the results are combined. A disadvantage of this approach is that the two filters must have similar frequency responses in order to perform a particular task, such as high pass filtering. The coefficients of the two filters must also be substantially different in order to enhance overall performance. The filters can have different lengths. Merely scaling one filter to form the second filter would be ineffective. Finally, the coefficients of the second filter must be substantially different from the negation of the coefficients of the first filter.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A medical ultrasound imaging system comprising:
    means for transmitting ultrasound energy into a target region of a patient;
    means for receiving ultrasound energy that was transmitted into the target region of the patient and providing a received signal;
    means for converting said received signal to a group of input data samples;
    a finite impulse response digital clutter filter for removing low frequency clutter from the input data samples, comprising
        multiplier means for multiplying said group of input data samples by a set of coefficients in a first order to provide first intermediate results and for multiplying said group of input data samples by said set of coefficients in a second order that is the reverse of said first order to provide second intermediate results, and
        summing means for summing said first intermediate results to provide a first output sample and for summing said second intermediate results to provide a second output sample, said multiplier means and said summing means processing multiple groups of input samples to provide multiple first and second output samples; means responsive to said multiple first and second output samples for estimating velocities in said target region; and
    means for displaying the velocities in said target region.

2. A medical ultrasound imaging system as defined in claim 1 wherein said finite impulse response digital filter further includes delay means for delaying said group of input data samples by successive discrete time increments to provide delayed input samples to said multiplier means substantially simultaneously, wherein said first output sample and said second output sample are generated substantially simultaneously.

3. A medical ultrasound imaging system as defined in claim 2 wherein said multiplier means comprises a plurality of first multipliers for multiplying said delayed input samples by said set of coefficients in said first order to provide said first intermediate results and a plurality of second multipliers for multiplying said delayed input samples by said set of coefficients in said second order to provide said second intermediate results, and wherein said summing means comprises first summing means for summing said first intermediate results to provide said first output sample, and second summing means for summing said second intermediate results to provide said second output sample.

4. A medical ultrasound imaging system as defined in claim 2 wherein said delay means comprises a shift register having one stage for each of said discrete time increments.

5. A medical ultrasound imaging system as defined in claim 1 further including a plurality of coefficient registers for storing said set of coefficients.

6. A medical ultrasound imaging system as defined in claim 1 wherein said multiplier means comprises a plurality of first multipliers for multiplying said input data samples by the coefficients of said set of coefficients in said first order to provide said first intermediate results and a plurality of second multipliers for multiplying said input data samples by the coefficients of said set of coefficients in said second order to provide said second intermediate results, and wherein said summing means comprises a plurality of first accumulators respectively coupled to said first multipliers for sequentially accumulating the first intermediate results generated by said first multipliers and a plurality of second accumulators respectively coupled to the outputs of said second multipliers for sequentially accumulating the second intermediate results generated by said second multipliers, each of said first accumulators providing one of said first output samples after accumulation of said first intermediate results and each of said second accumulators providing one of said second output samples after accumulation of said second intermediate results.

7. A medical ultrasound imaging system as defined in claim 6 wherein said finite impulse response digital filter further includes a plurality of first multiplexers for providing selected coefficients to said first multipliers and a plurality of second multiplexers for providing selected coefficients to said second multipliers.

8. A medical ultrasound imaging system as defined in claim 7 wherein said finite impulse response digital filter further includes a plurality of first output buffer registers for receiving said multiple first output samples from said first accumulators, a plurality of second output buffer registers for receiving said multiple second output samples from said second accumulators and means for sequentially outputting the contents of said first output buffer registers and said second output buffer registers on a single output line.

9. A medical ultrasound imaging system as defined in claim 6 further including a plurality of coefficient registers for storing said set of coefficients.

10. A medical ultrasound imaging system comprising:
means for transmitting ultrasound energy into a target region of a patient;
means for receiving ultrasound energy that was transmitted into the target region of the patient and providing a received signal;
means for converting said received signal to a group of input data samples;
a finite impulse response digital clutter filter for removing low frequency clutter from the input data samples, comprising
a plurality of first multipliers for multiplying a group of input data samples representing the signal by a set of coefficients in a first order to provide first intermediate results;
a plurality of second multipliers for multiplying said input data samples by said set of coefficients in a second order that is the reverse of said first order to provide second intermediate results;
a plurality of first accumulators respectively coupled to said first multipliers for sequentially accumulating the first intermediate results generated by said first multipliers and providing a plurality of first output samples after accumulation of said first intermediate results;
a plurality of second accumulators respectively coupled to the outputs of said second multipliers for sequentially accumulating the second intermediate results generated by said second multipliers and providing a plurality of second output samples after accumulation of said second intermediate results;
means for supplying selected coefficients of said set of coefficients to said first multipliers and to said second multipliers;
means responsive to said first and second output samples for estimating velocities in said target region; and
means for displaying the velocities in said target region.

* * * * *